(12) United States Patent
Katsap et al.

(10) Patent No.: US 6,232,040 B1
(45) Date of Patent: May 15, 2001

(54) METHOD OF ELECTRON BEAM EXPOSURE UTILIZING EMITTER WITH CONDUCTIVE MESH GRID

(75) Inventors: Victor Katsap, Belle Mead; James Alexander Liddle, Westfield; Warren Kazmir Waskiewicz, Clinton, all of NJ (US)

(73) Assignee: Agere Systems, Inc., Berkeley Heights, NJ (US)

( * ) Notice: Subject to any disclaimer, the term of this patent is extended or adjusted under 35 U.S.C. 154(b) by 0 days.

(21) Appl. No.: 09/306,287

(22) Filed: May 6, 1999

(51) Int. Cl.[7] .................................................. G03C 5/00

(52) U.S. Cl. ............................................ 430/296; 430/942

(58) Field of Search .................................... 430/296, 942

(56) References Cited

U.S. PATENT DOCUMENTS 4,588,928 * 5/1986 Lin et al. .
5,079,112 * 1/1992 Berger et al. .
5,258,246 * 11/1993 Berger et al. .

* cited by examiner

Primary Examiner—Christopher G. Young
(74) Attorney, Agent, or Firm—Thomas, Kayden, Horstemeyer & Risley, LLC

(57) ABSTRACT

The specification describes a method and apparatus for electron beam lithography wherein a Wehnelt electron gun is modified to improve the uniformity of the electron beam. A mesh grid is applied to the Wehnelt aperture and the mesh grid functions as a multiple secondary emitter to produce a uniform beam flux over a wide area. The grid voltage of the modified gun is substantially lower than in a conventional Wehnelt gun, i.e. less than 100 volts, which can be switched conveniently and economically using semiconductor drive circuits.

3 Claims, 5 Drawing Sheets

METHOD OF ELECTRON BEAM EXPOSURE UTILIZING EMITTER WITH CONDUCTIVE MESH GRID

FIELD OF THE INVENTION

This invention relates to electron beam lithography apparatus used for the manufacture of semiconductor integrated circuits.

BACKGROUND OF THE INVENTION

Electron beam exposure tools have been used for lithography in semiconductor processing for more than two decades. The first e-beam exposure tools were based on the flying spot concept of a highly focused beam, raster scanned over the object plane. The electron beam is modulated as it scans so that the beam itself generates the lithographic pattern. These tools have been widely used for high precision tasks, such as lithographic mask making, but the raster scan mode is found to be too slow to enable the high throughput required in semiconductor wafer processing. The electron source in this equipment is similar to that used in electron microscopes, i.e. a high brightness source focused to a small spot beam.

More recently, a new electron beam exposure tool was developed based on the SCALPEL (SCattering with Angular Limitation Projection Electron-beam Lithography) technique. In this tool, a wide area electron beam is projected through a lithographic mask onto the object plane. Since relatively large areas of a semiconductor wafer (e.g. 1 mm$^2$) can be exposed at a time, throughput is acceptable. The high resolution of this tool makes it attractive for ultra fine line lithography, i.e sub-micron.

The requirements for the electron beam source in SCALPEL exposure tools differ significantly from those of a conventional focused beam exposure tool, or a conventional TEM or SEM. While high resolution imaging is still a primary goal, this must be achieved at relatively high (10–100 $\mu$A) gun currents in order to realize economic wafer throughput. The axial brightness required is relatively low, e.g. $10^2$ to $10^4$ Acm$^{-2}$sr$^{-1}$, as compared with a value of $10^6$ to $10^9$ Acm$^{-2}$sr$^{-1}$ for a typical focused beam source. However, the beam flux over the larger area must be highly uniform to obtain the required lithographic dose latitude and CD control.

A formidable hurdle in the development of SCALPEL tools was the development of an electron source that provides uniform electron flux over a relatively large area, has relatively low brightness, and has an electron emitter with a sufficient lifetime to avoid excessive downtime. Lanthanum hexaboride (LaB$_6$) emitters in a modified Wehnelt electron gun arrangement were found to be promising for this application, and the first SCALPEL tools were built with these electron sources. Efforts to improve the uniformity of the electron emission profile over the surface of the LaB$_6$ have continued, but with limited success. Replacement of the LaB$_6$ emitter with a simple tantalum disk was found to improve the surface emission uniformity and stability. While SCALPEL systems are regarded as highly successful fine line lithographic exposure tools, efforts continue toward improving the efficiency and uniformity of the electron beam source.

STATEMENT OF THE INVENTION

We have developed a new electron beam source for SCALPEL systems which uses an electron beam shaping element to smooth the electron beam profile of the primary emitting surface over the wide emission area. The beam shaping element is a mesh grid that is installed over the opening in the Wehnelt gun. The mesh grid is an equipotential screen with each aperture in the screen acting as a separate Wehnelt emitter with its own funnel-shaped electrical field. The result is a highly uniform wide area electron beam that is ideally suited for SCALPEL tools.

The optical analog of the proposed gridded Wehnelt is a fly's eye lens, or scatter plates or diffusers, which transform non-uniform light beams into uniform beams in optical illumination systems.

The invention will be described more specifically in the following detailed description which, taken with the drawing, will provide a greater understanding of the features that distinguish this invention from conventional electron beam sources.

DETAILED DESCRIPTION

Figure 1:
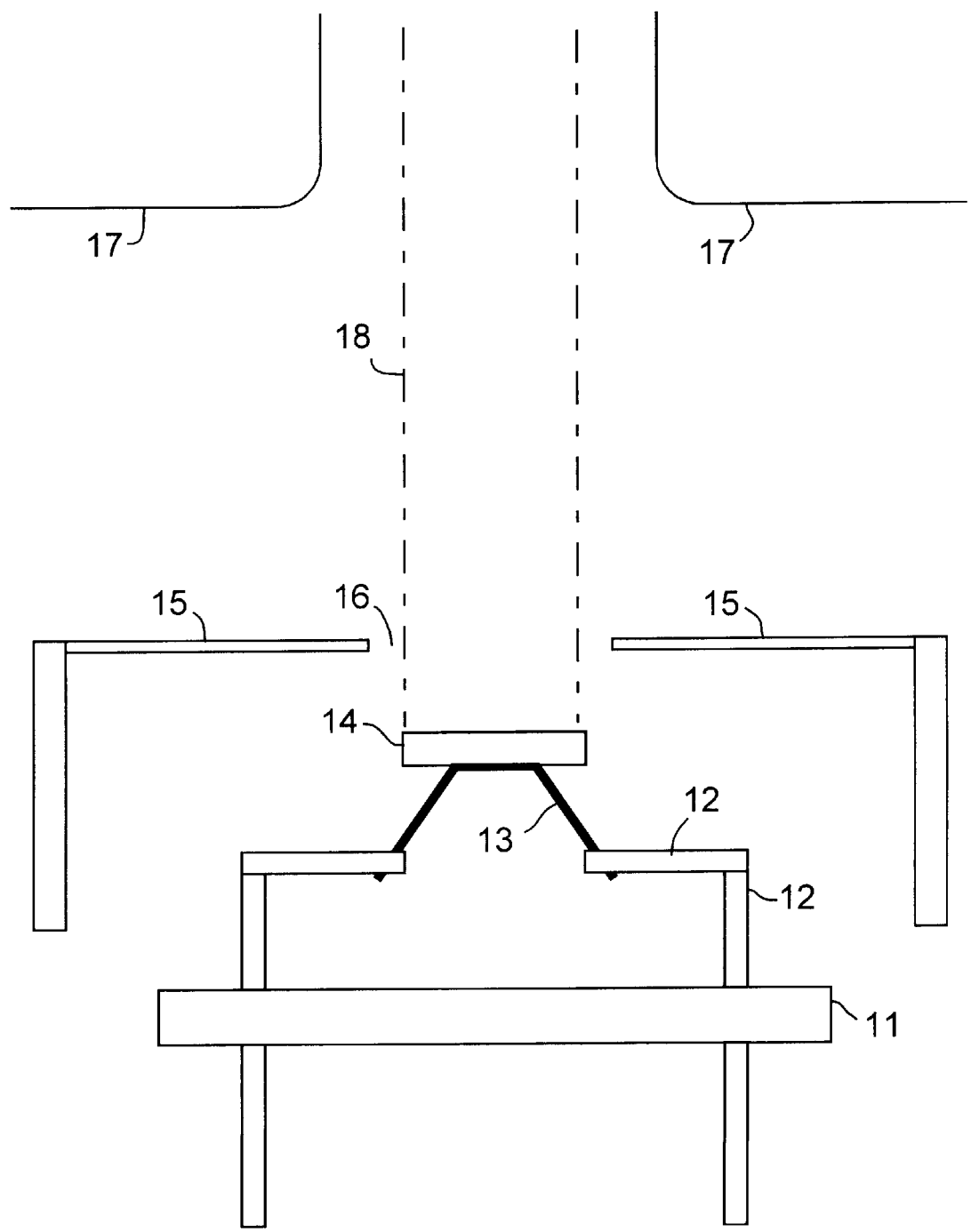
FIGS. 1 is a schematic diagram of a conventional Wehnelt electron gun with a tantalum disk emitter.

Referring to FIG. 1, a conventional Wehnelt electron gun assembly is shown with base 11, cathode support arms 12, cathode filament 13, Wehnelt electrode comprised of Wehnelt support arms 15 and conventional Wehnelt aperture 16. The base 11 may be ceramic, the support members 12 may be tantalum, steel, or molybdenum. The filament 13 may be tungsten wire, the material forming the Wehnelt aperture may be steel or tantalum, and the electron emitter 14 is, e.g., a tantalum disk. The effective area of the electron emitter is typically in the range of 0.5–3 mm$^2$. The electron emitter is preferably a disk with a diameter in the range 0.5-2.0 mm. The anode is shown schematically at 17, and the electron beam at 18. For simplicity the beam control apparatus, which is conventional and well known in the art, is not shown. It will be appreciated by those skilled in the art that the dimensions in the figures are not necessarily to scale.

An important feature of the electron source for SCALPEL exposure tools is relatively low electron beam brightness, as mentioned earlier. For most effective exposures, it is preferred that beam brightness be limited to a value less than $10^4$ Acm$^{-2}$sr$^{-1}$. This is in contrast with conventional scanning electron beam exposure tools which are typically optimized for maximum brightness. See e.g. U.S. Pat. No. 4,588,928 issued May 13, 1986 to Liu et al.

Figure 2:
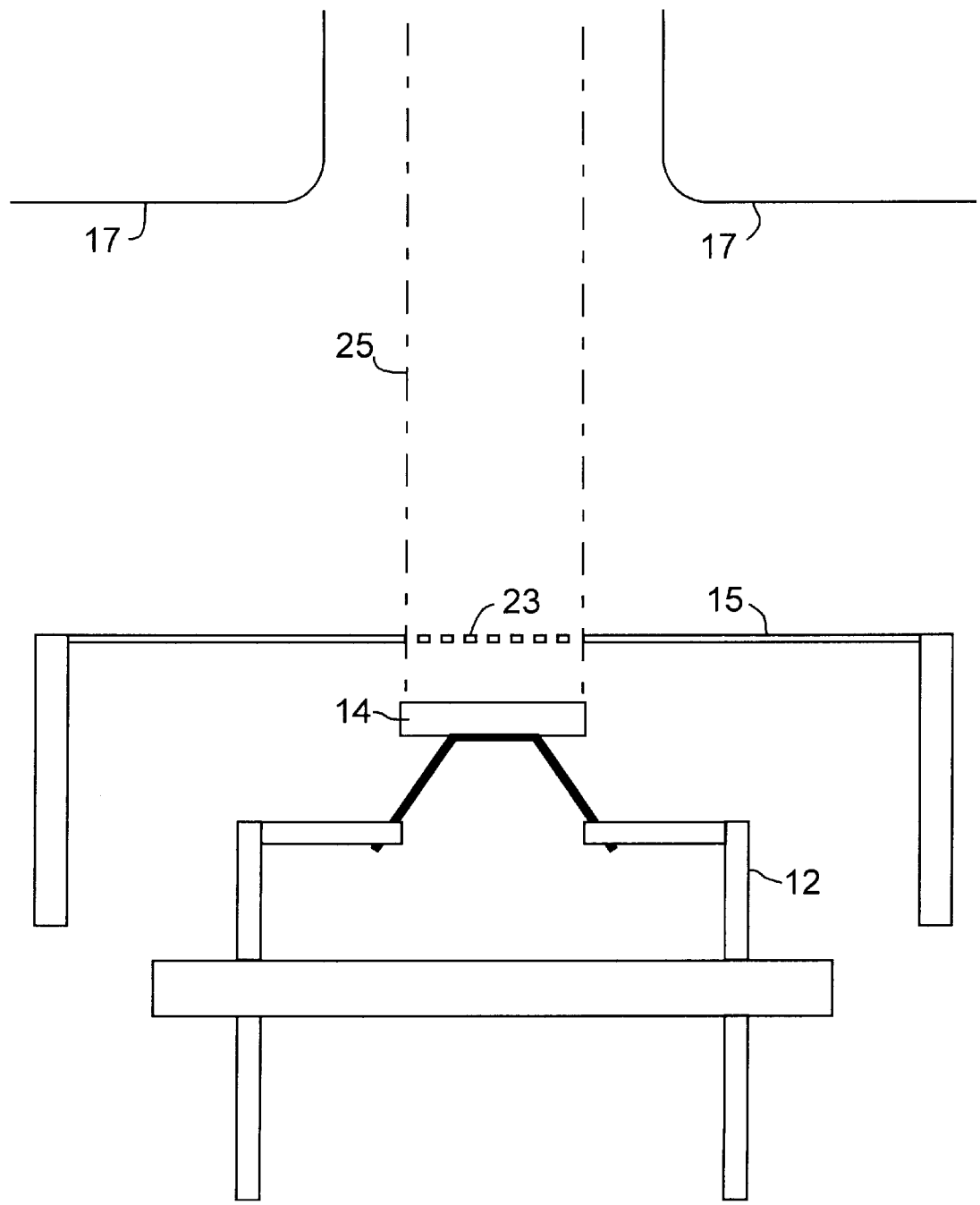
FIG. 2 is a schematic diagram of a Wehnelt electron gun modified in accordance with the invention.

The improved electron gun according to the invention is shown in FIG. 2. The opening for the Wehnelt is provided with mesh grid 23, disposed in the path of the electron emission 25. The mesh grid 23 is at a potential equal to the Wehnelt electrode and functions as a secondary emitter with multiple sources.

Figure 3:
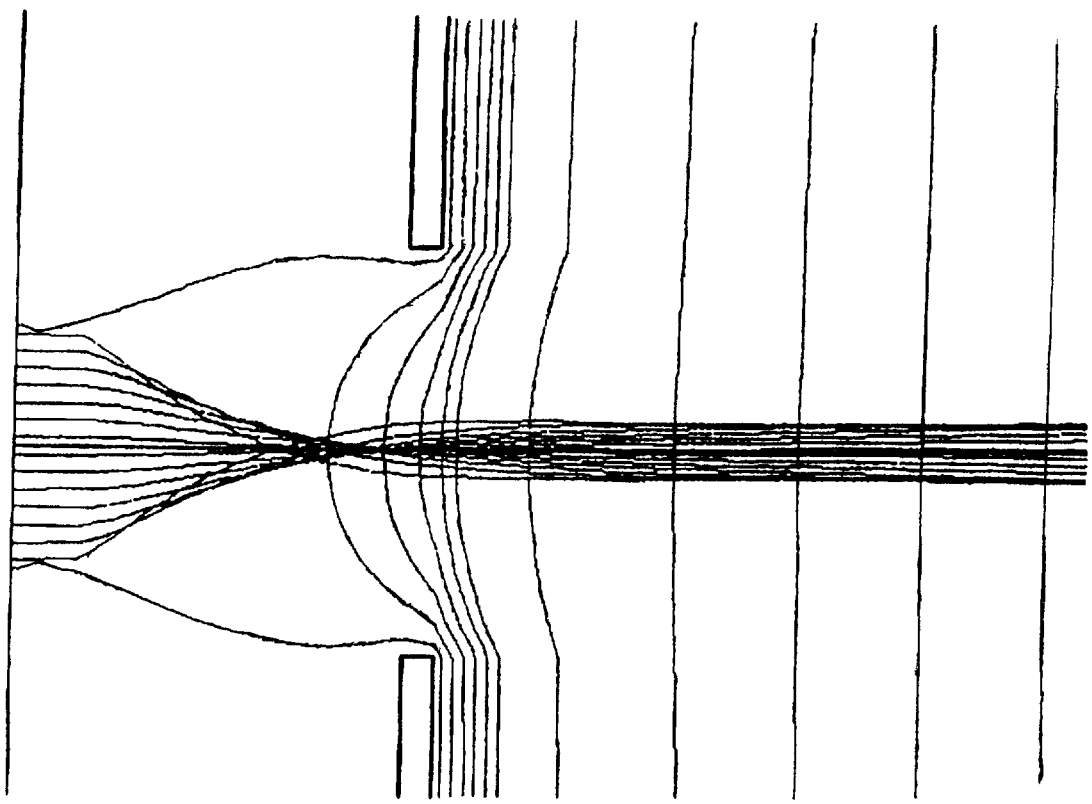
FIG. 3 is a schematic representation of the electron emission profile from the mesh grid of a conventional Wehnelt electron gun.
Figure 4:
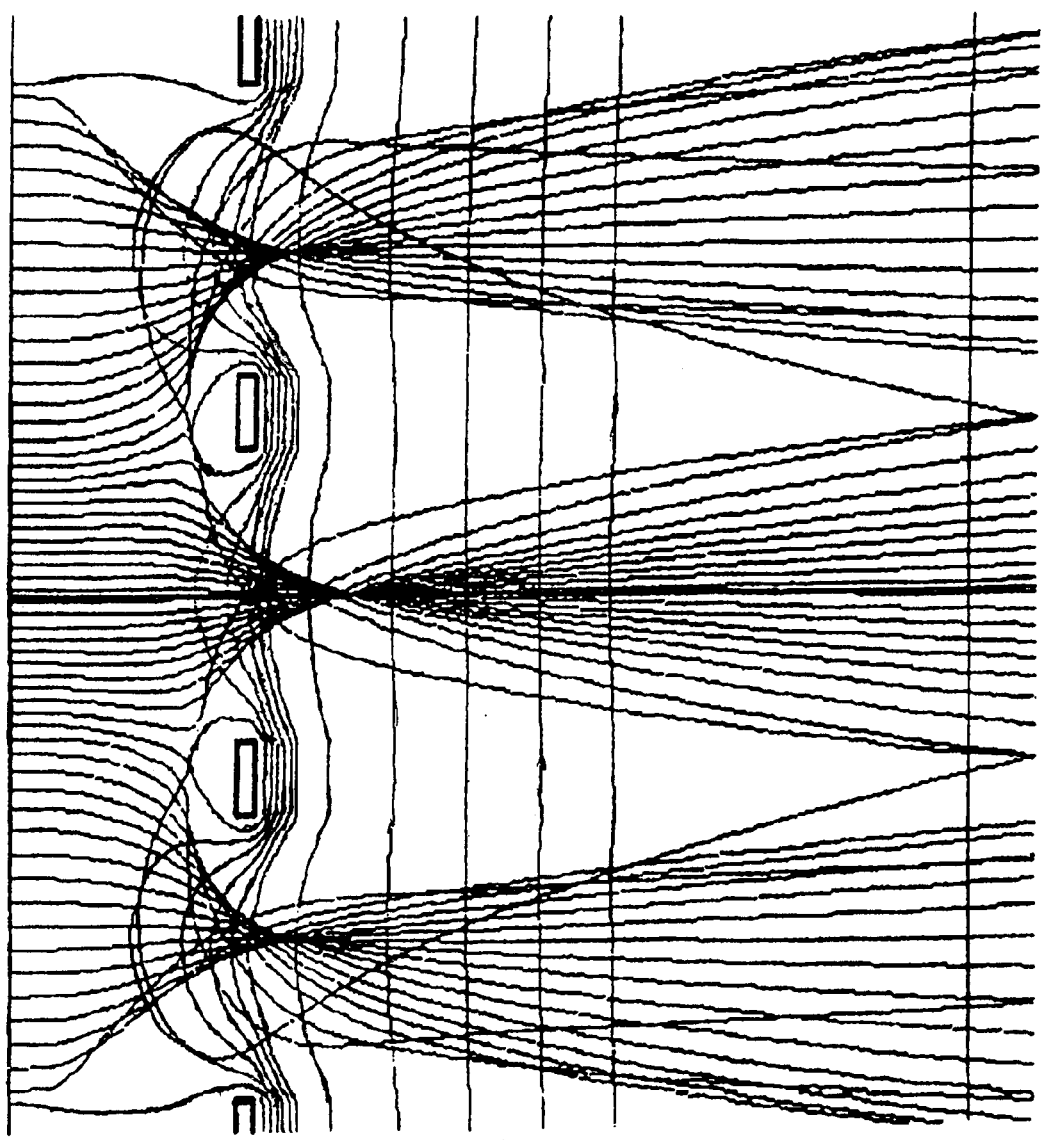
FIG. 4 is a schematic representation of the electron emission profile from the mesh grid of the modified Wehnelt electron gun of the invention.

The electron emission pattern from a standard round bore Wehnelt gun, i.e. the gun of FIG. 1, is shown in FIG. 3. The relatively non-uniform, bell curve shaped output from the Wehnelt is evident. The electron emission pattern from the mesh grid equipped Wehnelt gun of the invention, i.e. the gun of FIG. 2, is shown in FIG. 4. The multiple emission patterns can be seen, which serve to spatially distribute the electron flux across a wide aperture and ensure a flat averaged electrical field over the cathode surface. At the object plane, the individual electron beams overlap and the integrated electron flux is highly uniform.

The screen element that forms the mesh grid can have a variety of configurations. The simplest is a conventional woven screen with square apertures. However, the screen may have triangular shaped apertures, hexagonal close packed apertures, or even circular apertures. It can be woven or non-woven. Techniques for forming suitable screens from a continuous layer may occur to those skilled in the art. For example, multiple openings in a continuous metal sheet or foil can be produced by techniques such as laser drilling. Fine meshes can also be formed by electroforming techniques. The mesh grid should be electrically conducting but the material of the mesh is otherwise is relatively inconsequential. Tantalum, tungsten, molybdenum, titanium, or even steel are suitable materials. These metals may be overcoated with, e.g., gold or hafnium to decrease parasitic emission from the mesh grid. The mesh grid preferably has a transparency in the range 40–90%, with transparency defined as the two dimensional void space divided by the overall mesh grid area. The spacing between the electron emitter surface and the mesh grid is typically in the range 0.1 to 1.0 mm.

Figure 5:
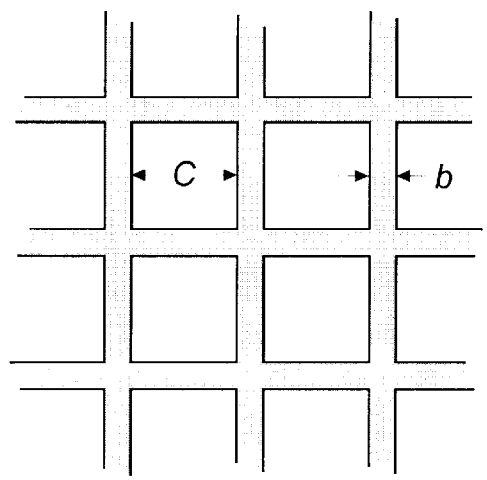
FIG. 5 is a schematic diagram of a mesh grid of the invention showing the relevant dimensions.

With reference to FIG. 5, the mesh grid has bars "b" of approximately 50 $\mu$m, and square cells with "C" approximately 200 $\mu$m. This mesh grid has a transparency of approximately 65%. Mesh grid structures that were found suitable are represented by the examples in the following table.

TABLE I

|  | Cell dimension "C", $\mu$m | Bar width "b", $\mu$m |
| --- | --- | --- |
| Grid #100 | 200 | 50 |
| Grid #200 | 88 | 37 |
| Grid #300 | 54 | 31 |

The cell dimension "C" is the width of the opening in a mesh with a square opening. For a rectangular mesh grid the dimension "C" is approximately the square root of the area of the opening. It is preferred that the openings be approximately symmetrical, i.e. square or round.

The thickness t of the mesh grid is relatively immaterial except that the aspect ratio of the openings, C/t, is preferably greater than 1. Desirable relationships between the mesh grid parameters is given by:

$D:b>=4; C:t>=1.5$ where D is the cathode-to-grid distance.

As indicated above the electron gun of the invention is most advantageously utilized as the electron source in a SCALPEL electron beam lithography machine. Fabrication of semiconductor devices on semiconductor wafers in current industry practice contemplates the exposure of polymer resist materials with fine line patterns of actinic radiation, in this case, electron beam radiation. This is achieved in conventional practice by directing the actinic radiation through a lithographic mask and onto a resist coated substrate. The mask may be positioned close to the substrate for proximity printing or may be placed away from the substrate and the image of the mask projected onto the substrate for projection printing.

SCALPEL lithography tools are characterized by high contrast image patterns at very small linewidths, i.e 0.1 $\mu$m or less. They produce high resolution images with wide process latitude, coupled with the high throughput of optical projection systems. The high throughput is made possible by using a flood beam of electrons to expose a relatively large area of the wafer. Electron beam optics, comprising standard magnetic field beam steering and focusing, are used to image the flood beam onto the lithographic mask, and thereafter, onto the substrate, i.e. the resist coated wafer. The lithographic mask is composed of regions of high electron scattering and regions of low electron scattering, which regions define the features desired in the mask pattern. Details of suitable mask structures can be found in U.S. Pat. No. 5,079,112 issued Jan. 7, 1992, and U.S. Pat. No. 5,258,246 issued Nov. 2, 1993, both to Berger et al.

An important feature of the SCALPEL tool is the back focal plane filter that is placed between the lithographic mask and the substrate. The back focal plane filter functions by blocking the highly scattered electrons while passing the weakly scattered electrons, thus forming the image pattern on the substrate. The blocking filter thus absorbs the unwanted radiation in the image. This is in contrast to conventional lithography tools in which the unwanted radiation in the image is absorbed by the mask itself, contributing to heating and distortion of the mask, and to reduced mask lifetime.

Figure 6:
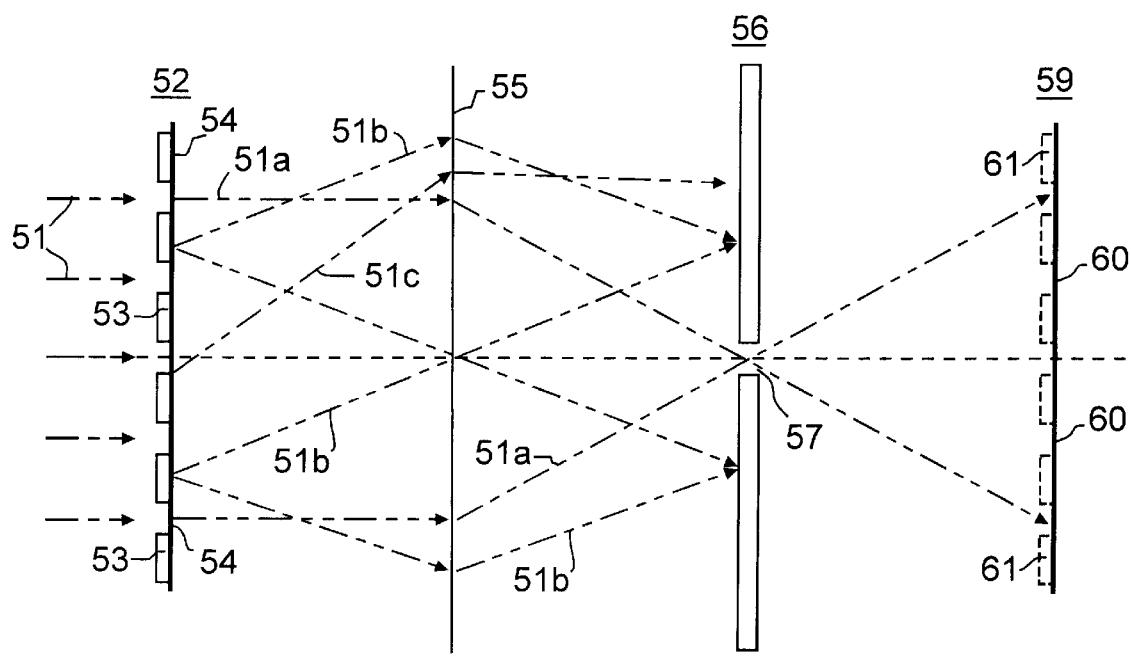
FIG. 6 is a schematic diagram illustrating the principles of the SCALPEL exposure system.

The principles on which SCALPEL lithography systems operate are illustrated by FIG. 6. Lithographic mask 52 is illuminated with a uniform flood beam 51 of 100 keV electrons produced by the electron gun of FIG. 2. The membrane mask 52 comprises regions 53 of high scattering material and regions 54 of low scattering material. The weakly scattered portions of the beam, i.e. rays 51$a$, are focused by magnetic lens 55 through the aperture 57 of the back focal plane blocking filter 56. The back focal plane filter 56 may be a silicon wafer or other material suitable for blocking electrons. The highly scattered portions of the electron beam, represented here by rays 51$b$ and 51$c$, are blocked by the back focal plane filter 56. The electron beam image that passes the back focal plane blocking filter 56 is focused onto a resist coated substrate located at the optical plane represented by 59. Regions 60 replicate the features 54 of the lithographic mask 52, i.e. the regions to be exposed, and regions 61 replicate the features 53 of the lithographic mask, i.e. the regions that are not to be exposed. These regions are interchangeable, as is well known in the art, to produce either negative or positive resist patterns.

The vitalizing feature of the SCALPEL tool is the positioning of a blocking filter at or near the back focal plane of the electron beam image. Further details of SCALPEL systems can be found in U.S. Pat. No. 5,079,112 issued Jan. 7, 1992, and U.S. Pat. No. 5,258,246 issued Nov. 2, 1993, both to Berger et al. These patents are incorporated herein by reference for such details that may be found useful for the practice of the invention.

It should be understood that the figures included with this description are schematic and not necessarily to scale. Device configurations, etc., are not intended to convey any limitation on the device structures described here.

For the purpose of definition here, and in the appended claims, the term Wehnelt emitter is intended to define a solid metal body with an approximately flat emitting surface, said flat emitting surface being symmetrical, i.e. having the shape of a circle or regular polygon. Also for the purpose of definition, the term substrate is used herein to define the object plane of the electron beam exposure system whether or not there is a semiconductor workpiece present on the substrate. The term electron optics plane may be used to describe an x-y plane in space in the electron beam exposure system between the electron emitting surface of the electron gun and the surface onto which the electron beam image is focused, i.e. the object plane where the semiconductor wafer is situated.

Whereas the electron beam optics required for implementing the invention are well known and not described here in detail, the grid bias required for far field beam shaping and for regulating exposure dose in the modified Wehnelt gun of the invention is not. The cut-off bias in conventional Wehnelt guns is typically 400 V or more. Because of the presence of the mesh grid in the modified Wehnelt gun of the invention, cut-off for the grid bias is less than 100 V, and in most structures, e.g. the embodiment described above, less than 50 V. This voltage can be applied directly to the Wehnelt electrode and can be switched or modulated using semiconductor drive circuits, which sharply reduces the cost of the apparatus and the response time of the beam control system.

Because of the relatively low cut-off voltage for the electron gun design of the invention, it is convenient and relatively simple to further enhance beam uniformity by introducing a deliberate beam wobble in the electron beam source. The wobble can be produced by a low frequency, i.e. 1–10 kHz, beam drive signal that is superimposed on the Wehnelt grid bias. This wobble changes the beam pattern at the frequency of the wobble so that any peaks or hot spots in the electron beam front are moved periodically and the integrated flux over time is more spatially equalized.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for the manufacture of semiconductor integrated circuits comprising at least one lithographic step in which a patterned electron beam is projected onto the surface of a resist coated semiconductor wafer using a lens system, the method comprising the steps of:

(a) projecting a beam of electrons onto said resist coated semiconductor wafer sequentially through:

(i) a lithographic mask, and (ii) a back focal plane filter, said back focal plane filter being essentially opaque to electrons in said electron beam, the method characterized in that said electron beam is produced by an electron gun and said electron gun is operated by (b) establishing a bias between an electron emitter as cathode and an anode spaced from said electron emitter, said electron gun having a conductive mesh grid between said electron emitter and said anode so that said electron beam flows from said electron emitter, through said conductive mesh grid, to said anode.

2. The method of claim 1 wherein said electron beam has a brightness of less than $10^4$ $Acm^{-2}sr^{-1}$.

3. The method of claim 1 wherein said mesh grid has a transparency between 40–90%.

* * * * *